United States Patent [19]

Katsumi

[11] Patent Number: 4,849,642
[45] Date of Patent: Jul. 18, 1989

[54] METHOD FOR REPAIRING A PATTERN FILM
[75] Inventor: Suzuki Katsumi, Tokyo, Japan
[73] Assignee: Seiko Instruments Inc., Chiba, Japan
[21] Appl. No.: 130,886
[22] Filed: Dec. 10, 1987
[30] Foreign Application Priority Data Dec. 19, 1986 [JP] Japan .................. 61-303166

[51] Int. Cl.⁴ .................................... G21K 5/00
[52] U.S. Cl. .................................... 250/492.2; 430/5; 250/492.3
[58] Field of Search ........... 250/492.2, 492.21, 492.23, 250/492.1; 430/5, 296; 427/431

[56] References Cited
U.S. PATENT DOCUMENTS
4,727,234 2/1988 Oprysko et al. ............... 219/121.6

FOREIGN PATENT DOCUMENTS
53-135276 11/1978 Japan ............................ 430/5
59-208720 11/1984 Japan .......................... 430/296
60-94728 5/1985 Japan.
60-211935 10/1985 Japan ....................... 250/492.2

Primary Examiner—Carolyn E. Fields
Assistant Examiner—John A. Miller
Attorney, Agent, or Firm—Spensley, Horn, Jubas & Lubitz

[57] ABSTRACT

According to the present invention, correction of a transparent defect of a photomask or rearrangement of a pattern film on a substrate such as semiconductor is corrected or rearranged by carrying out a first step in which an edge portion which requires a relatively high degree of precision is finished with a high degree of precision by irradiating it with a scanning focused ion beam within a short period of time and a second step in which the remaining portion to be corrected or rearranged including its peripheral portion is scanned with a focused ion beam so as to be corrected or rearranged, whereby the edge portion of a correcting or rearranging area with a relatively large area which has heretofore given rise to a problem is finished with a high degree of precision.

4 Claims, 1 Drawing Sheet

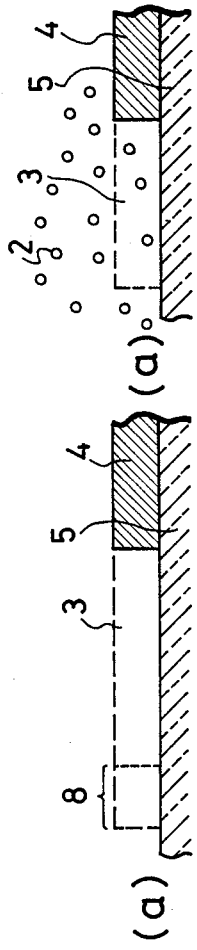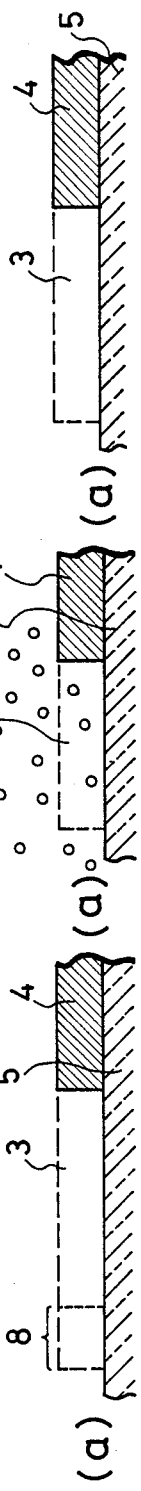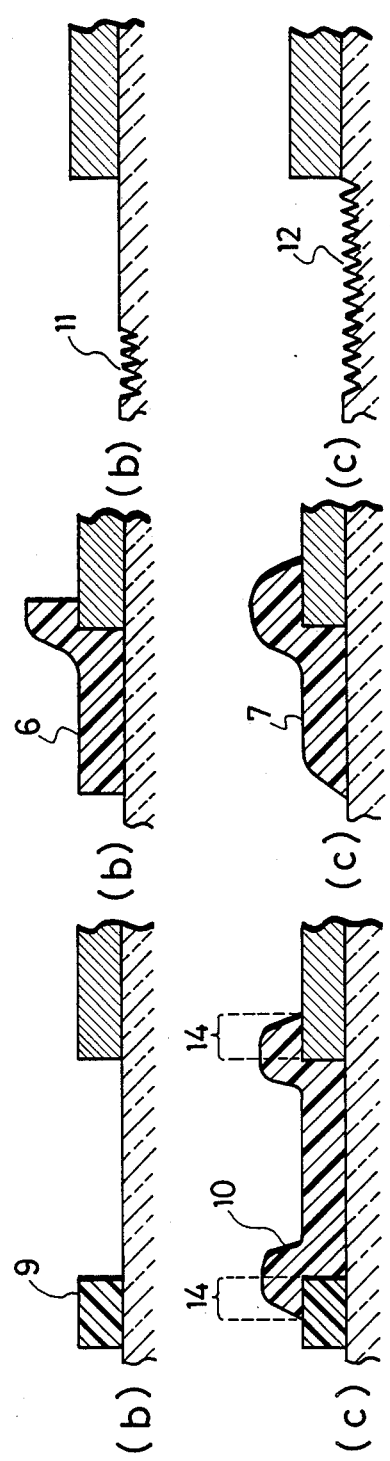

METHOD FOR REPAIRING A PATTERN FILM

BACKGROUND OF THE INVENTION

This invention relates to the method for repairing a pattern film on a substrate such as a photomask for IC., a semiconductor etc., which is carried out using a focused ion beam.

In a typical conventional method, as shown in FIG. 2a and 2b a mask is disposed in an organic compound vapor 2, and a region 3 including a defect portion of a pattern film 4 which is to be corrected is irradiated with a scanning focused ion beam to form a pattern film 6.

In this case, irradiating with the focused scanning ion beam is repeated a predetermined number of times in order to form a pattern film having predetermined thickness.

However, if, during the focused ion beam scanning, the focused ion beam is drifted at a rate of X $\mu$m/hr due to some cause such as a change in an ion source, an electric circuit for allowing the focused ion beam to scan, or a stage for moving a mask secured thereto, a correcting pattern film 7 having an edge finished with a low degree of precision may be formed as shown in FIG. 2, disadvantageously. This gives rise to a serious problem in the case of correcting a transparent defect of the photomask which takes much time to be corrected, that is, which has a relatively large area.

BRIEF SUMMARY OF INVENTION

In this invention there is provided a process in which irradiating with a scanning focused ion beam is carried out in two steps, that is, a first step in which an edge portion having a relatively small area which requires a relatively high degree of precision is scanned a relatively short period of time, and second step in which the remaining defect portion which has a relatively large area having a relatively high degree of freedom in terms of precision is scanned.

With the above-described process, irradiating with the scanning focused ion beam is carried out in two steps to correct a white spot defect (transparent defect), an edge portion, which has heretofore been finished with a relatively low degree of precision in this case of correction of a defect with a relatively large area, is scanned within a relatively short period time, so that it is possible to correct a white spot defect with a high degree of precision.

It is an object of the invention to provide a method of correction and rearrangement having a high degree of precision.

Other and further objects, feature and advantages of the inventon will appear more fully from the following description.

BRIEF DESCRIPTION OF DRAWINGS

FIG. 1(a), 1(b) and 1(c) show the correction procedure in accordance with one embodiment of the invention.

FIG. 2(a), 2(b) and 2(c) show the correction procedure in accordance with a conventional method.

FIG. 3(a), 3(b) and 3(c) show the correction procedure in accordance with another embodiment of the invention.

DETAILED DESCRIPTION

One embodiment of present invention will be described hereunder with reference to the drawings. FIG. 1(a) to 1(c) illustrate one embodiment of the invention according to the correction procedure. FIG. 1(a) shows a photomask having a transparent defect 3 which has an edge portion 8. The photomask comprises a substrate 5 (transparent materials such as glass) and a pattern film 4 (opaque material such as chromium, chromium oxide and etc.) thereon. Although, the sample shown in FIG. 1(a) is a photomask, it is not limited to photomasks. This method can be applied to a pattern film formed on a semiconductor.

FIG. 1(b) shows a first step in which a region including an edge portion 8 which requires finishing with a relatively high degree of precision is corrected. In this step, since the region to be corrected has a relatively small area, even if a drift of X $\mu$m/hr occurs, the necessary degree of precision in correction is obtained, and a pattern 9 film is formed at the edge portion 8 with a high degree of precision. In sum, the pattern 9 is formed, since an organic compound vapour is supplied onto the defect 3 by a nozzle (not shown in fig.), and only the edge portion 8 is irradiated with a scanning focused ion beam (not shown in fig.).

FIG. 1(c) shows a second step in which the remaining portion of the transparent defect 3 is corrected. In this step, a region including a defect portion left uncorrected in the first step and which includes a predetermined width extending outside the remaining defect portion is irradiated with the scanning focused ion beam to thereby correct the remaining defect portion of a relatively large area. A pattern film 10 is formed in this step.

The procedure may be reversed, that is, it is also possible to first correct a portion having a relatively large area, exclusive of the edge portion 8, and then correct the edge portion 8 within a short period of time.

It should be noted that the pattern film is, for example, a carbon film, in this case of correction of a photomask. If the work-piece is a semiconductor, the added pattern film is of metal, such as Al, W, Cr, etc.

Further, the transparent defect correcting method according to the present invention is also effective in the following case. Namely, as shown in FIG. 3(a) and 3(b), a glass substrate surface at the edge portion 8 of a transparent defect 3 is roughened by irradiation of a scanning focused ion beam so as to scatter light, and the remaining transparent defect portion 12 is then roughened so as to scatter light applied in the second step as shown in FIG. 3(c).

As has been described above, the present invention enables correction or rearrangement of a pattern film to be finished with a high degree of precision by a simple method in which a defect area a pattern film is corrected or rearranged in two steps, that is, correction or rearrangement of an edge portion which must be finished with a relatively high degree of precision and correction or rearrangement of the remaining portion.

I claim:

1. A method for correcting a transparent defect in a photomask, the photomask having an edge and the defect extending from, and constituting an interruption of the edge of the photomask, said method comprising: applying a first scanning focussed ion beam to only a portion of the defect which corresponds to the edge of the photomask for correcting the defect only in the portion; and applying a second scanning focussed ion beam to the remaining portion of the defect for correcting the remaining portion of the defect wherein applying the ion beam to the edge portion and the remaining portion are separate steps.

2. A method as defined in claim 1 wherein each of the steps of applying is carried out to reduce the transparency of the portion of the defect to which the scanning focussed ion beam is applied.

3. A method for rearranging a region of a pattern film on a substrate, the region being at a location containing an edge of the pattern film, said method comprising:

applying a first scanning focussed ion beam to only a portion of the region of the pattern film which corresponds to the edge of the pattern film for rearranging the pattern film only in the portion; and applying a second scanning focussed ion beam to the remaining portion of the region for rearranging the pattern film in the remaining portion of the region wherein applying the ion beam to the edge portion or the remaining portion are separate steps.

4. A method as defined in claim 3 wherein each of the steps of applying is carried out to deposit film material at the respective portion of the region.

* * * * *